(12) United States Patent
Liaw (10) Patent No.: US 8,809,963 B2
(45) Date of Patent: Aug. 19, 2014

(54) SRAM STRUCTURE WITH FINFETS HAVING MULTIPLE FINS

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/598,093

(22) Filed: Aug. 29, 2012

(65) Prior Publication Data

US 2012/0319212 A1 Dec. 20, 2012

Related U.S. Application Data

(62) Division of application No. 12/890,132, filed on Sep. 24, 2010, now Pat. No. 8,258,572.

(60) Provisional application No. 61/267,341, filed on Dec. 7, 2009.

(51) Int. Cl.
*H01L 27/11* (2006.01)

(52) U.S. Cl.
CPC .................................. *H01L 27/11* (2013.01)
USPC .......................................................... 257/390

(58) Field of Classification Search
CPC .... H01L 27/11; H01L 27/0886; H01L 29/785
USPC .......... 257/288, 327, 390, E29.262, E29.264, 257/E21.661, E27.098; 365/154
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 6,977,837 B2 * | 12/2005 | Watanabe et al. | 365/156 |
| 7,123,504 B2 * | 10/2006 | Yabe | 365/156 |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |

(Continued)

OTHER PUBLICATIONS

Kawasaki, H., et al., "Embedded Bulk FinFET SRAM Cell Technology with Planar FET Peripheral Circuit for *hp*32 nm node and beyond," IEEE Symposium on VLSI Technology Digest of Technical Papers, Oct. 2, 2006, 2 pp.

(Continued)

*Primary Examiner* — Michele Fan
(74) *Attorney, Agent, or Firm* — Slater and Matsil, L.L.P.

(57) ABSTRACT

A static random access memory (SRAM) cell includes a straight fin and a bended fin physically disconnected from the straight fin. The bended fin has a first portion and a second portion parallel to the straight fin. The distance between the first portion of the bended fin and the straight fin is smaller than the distance between the second portion of the bended fin and the straight fin. The SRAM cell includes a pull-down transistor including a portion of a first gate strip, which forms a first and a second sub pull-down transistor with the straight fin and the first portion of the bended fin, respectively. The SRAM cell further includes a pass-gate transistor including a portion of a second gate strip, which forms a first sub pass-gate transistor with the straight fin. The pull-down transistor includes more fins than the pass-gate transistor.

18 Claims, 8 Drawing Sheets

(56) References Cited

U.S. PATENT DOCUMENTS

| | | | |
|---|---|---|---|
| 7,528,465 | B2 | 5/2009 | King et al. |
| 7,605,449 | B2 | 10/2009 | Liu et al. |
| 7,667,234 | B2 | 2/2010 | Wang et al. |
| 7,812,373 | B2 * | 10/2010 | Bauer et al. .................. 257/206 |
| 8,035,170 | B2 * | 10/2011 | Inaba ........................... 257/401 |
| 8,059,452 | B2 * | 11/2011 | Liaw ............................ 365/154 |
| 8,124,976 | B2 * | 2/2012 | Takeda et al. ................... 257/69 |
| 8,368,148 | B2 * | 2/2013 | Inaba ........................... 257/369 |
| 2005/0073060 | A1 * | 4/2005 | Datta et al. .................... 257/903 |
| 2005/0153490 | A1 | 7/2005 | Yoon et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2008/0049484 | A1 * | 2/2008 | Sasaki ............................ 365/72 |
| 2008/0105932 | A1 | 5/2008 | Liaw |
| 2008/0191282 | A1 * | 8/2008 | Bauer et al. .................. 257/365 |
| 2008/0210981 | A1 * | 9/2008 | Chang et al. ................. 257/206 |
| 2008/0212392 | A1 * | 9/2008 | Bauer ...................... 365/230.05 |
| 2008/0290470 | A1 | 11/2008 | King et al. |
| 2008/0296632 | A1 | 12/2008 | Moroz et al. |
| 2008/0308848 | A1 | 12/2008 | Inaba |
| 2008/0308880 | A1 | 12/2008 | Inaba |
| 2009/0181477 | A1 | 7/2009 | King et al. |
| 2010/0109086 | A1 * | 5/2010 | Song et al. .................... 257/365 |
| 2010/0183958 | A1 * | 7/2010 | Inaba ................................ 430/5 |
| 2011/0012202 | A1 * | 1/2011 | Chang et al. .................. 257/350 |
| 2011/0018064 | A1 | 1/2011 | Doornbos |
| 2011/0204445 | A1 * | 8/2011 | Chang et al. .................. 257/347 |

OTHER PUBLICATIONS

Inaba, S., et al., "Direct evaluation of DC characteristic variability in FinFET SRAM Cell for 32 nm node and beyond," IEEE International Electron Devices Meeting, Dec. 10-12, 2007, pp. 487-490.

* cited by examiner

SRAM STRUCTURE WITH FINFETS HAVING MULTIPLE FINS

This application is a divisional of U.S. application Ser. No. 12/890,132 filed Sep. 24, 2010, entitled, "SRAM Structure with FinFETs Having Multiple Fins," which claims the benefit of U.S. Provisional Application No. 61/267,341 filed on Dec. 7, 2009, entitled "SRAM Structure with FinFETs Having Multiple Fins," which applications are hereby incorporated herein by reference.

TECHNICAL FIELD

This disclosure relates generally to integrated circuit devices, and more particularly to memory cells, and even more particularly to layout design and manufacturing methods of static random access memory (SRAM) cells comprising FinFETs.

BACKGROUND

Fin field-effect transistors (FinFETs) are widely used in integrated circuits for their increased gate widths over planar transistors. A major advantageous feature of the FinFETs is that they use small chip areas. To maximize this benefit, when used in high-density devices, for example, static random access memory (SRAM) arrays, the FinFETs were often designed as single-fin FinFETs.

The SRAMs with single-fin FinFETs, however, often suffer from low cell ratio problems such as low beta ratios. The beta ratios are the ratios of the drive currents of pull-down transistors to the drive currents of the respective pass-gate transistors. The beta ratios are important for the cell stability. Generally, the beta ratios are preferably greater than 1. In the formation of high-density SRAM arrays, however, this requirement results in process difficulties. For example, it is difficult to meet this requirement while at the same time keep the cell size small.

SUMMARY

In accordance with one aspect, a static random access memory (SRAM) cell includes a straight fin and a bended fin physically disconnected from the straight fin. The bended fin has a first portion and a second portion parallel to the straight fin. The distance between the first portion of the bended fin and the straight fin is smaller than the distance between the second portion of the bended fin and the straight fin. The SRAM cell includes a pull-down transistor including a portion of a first gate strip, which forms a first and a second sub pull-down transistor with the straight fin and the first portion of the bended fin, respectively. The SRAM cell further includes a pass-gate transistor including a portion of a second gate strip, which forms a first sub pass-gate transistor with the straight fin. The pull-down transistor includes more fins than the pass-gate transistor.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel static random access memory (SRAM) comprising multi-fin Fin field-effect transistors (FinFETs) and the corresponding layouts are presented. The variations of the embodiment are then discussed. Throughout the various views and illustrative embodiments, like reference numbers are used to designate like elements.

Figure 1:
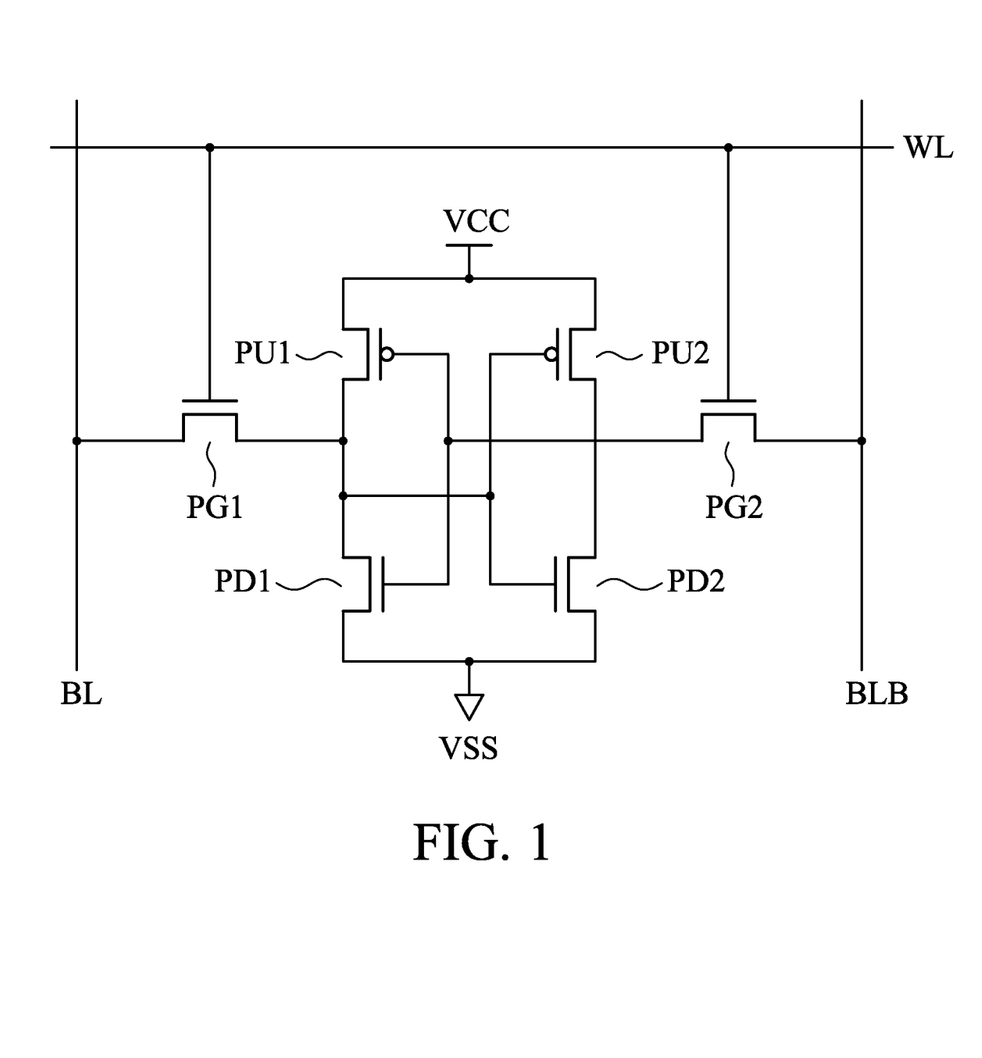
FIG. 1 illustrates a circuit diagram of a static random access memory cell (SRAM cell), wherein pull-down transistors of the SRAM cell are multi-fin FinFETs.

FIG. 1 illustrates a circuit diagram of an SRAM cell in accordance with an embodiment. The SRAM cell includes pass-gate transistors PG1 and PG2, pull-up transistors PU1 and PU2, and pull-down transistors PD1 and PD2. The gates of pass-gate transistors PG1 and PG2 are controlled by word-line WL that determines whether the current SRAM cell is selected or not. A latch formed of pull-up transistors PU1 and PU2 and pull-down transistors PD1 and PD2 stores a bit. The stored bit can be written into or read from the SRAM cell through bit lines BL and BLB. The SRAM cell is powered through a positive power supply node VCC, and power supply node VSS, which may be an electrical ground.

Pull-down transistors PD1 and PD2 may be multi-fin FinFETs, with each being formed of more than one semiconductor fin. Pass-gate transistors PG1 and PG2 and pull-up transistors PU1 and PU2, on the other hand, may be single-fin FinFETs or multi-fin FinFETs. Accordingly, by adjusting the numbers of fins in pull-down transistors PD1 and PD2 and pass-gate transistors PG1 and PG2, the beta ratio, which may be expressed as I_PD1/I_PG1 or I_PD2/I_PG2 (with I_PD1, I_PD2, I_PG1, and I_PG2 being drive current of transistors PD1, PD2, PG1, and PG2, respectively), may be adjusted to desirable values, for example, greater than 1. The alpha ratios, which may be I_PU1/I_PG1 or I_PU2/I_PG2 (with I_PU1 and I_PU2 being drive current of transistors PU1 and PU2, respectively), may also be adjusted to desirable values.

Figure 2:
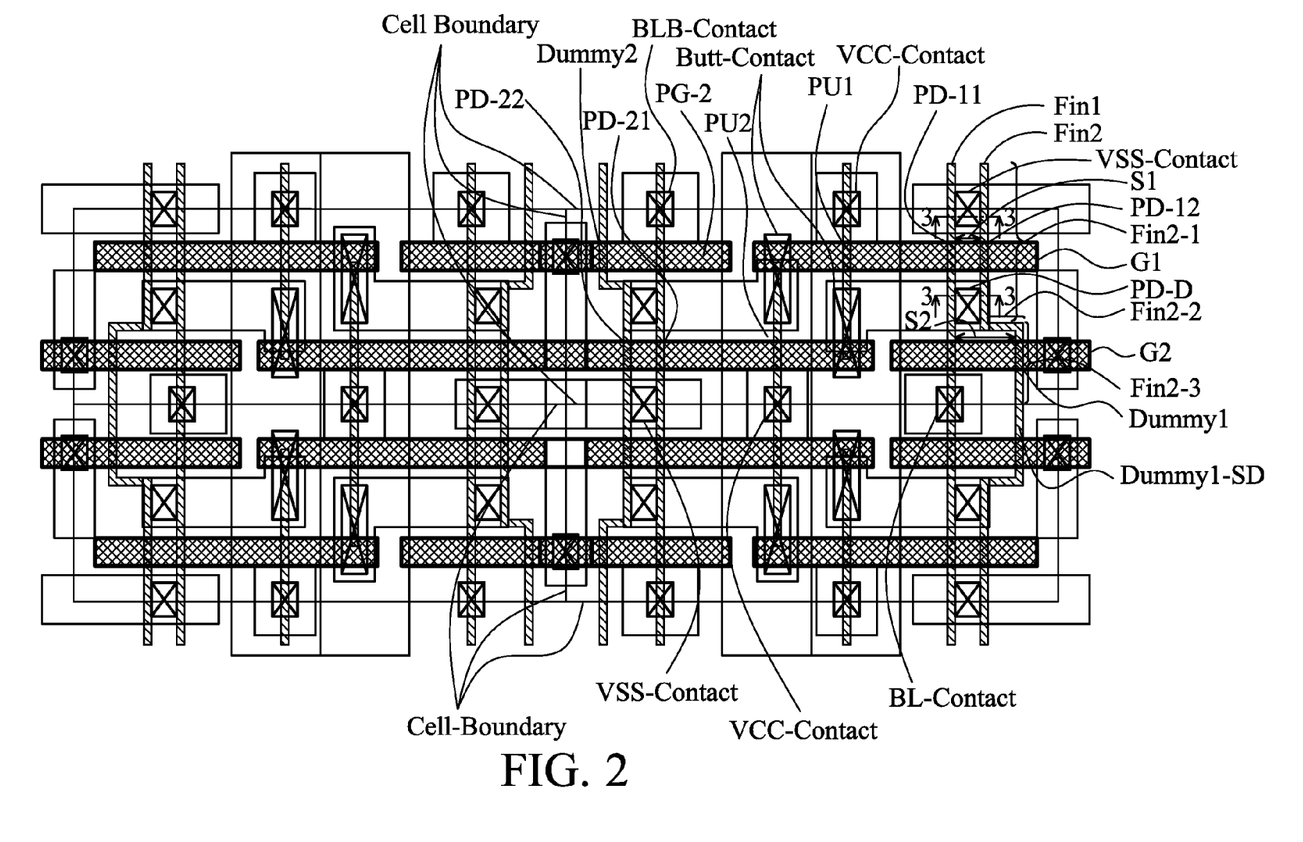
FIG. 2 illustrates a layout of the SRAM cell shown in FIG. 1 in accordance with an embodiment.

FIG. 2 illustrates a layout of the SRAM cell as shown in FIG. 1 in accordance with an embodiment, with the transistors in the SRAM cell being marked. The boundaries of unit cells are also marked. The illustrated portion includes four identical SRAM cells forming a 2×2 array. In an embodiment, the fins such as Fin1 and Fin2 in the SRAM cell have the same width, although they may also have different widths. In the following discussion, only a first port of the SRAM cell including transistors PG1, PD1, and PU1 is discussed in detail, and the complementary second port including transistors PG2, PD2, and PU2 may have essentially the same characteristics as the respective transistors in the first port. The details of the second port are hence not repeated. In FIG. 2 and FIGS. 4 through 7, various components such as VCC-contact, VSS-contact, butted-contact, BL-contact and BLB-contact are also illustrated, which are contacts whose functions may be found through their names. Throughout the description, a contact is also referred to as a contact plug.

Pull-down transistor PD1 (including and denoted as PD-11 and PD-12) includes two fins, Fin1 and Fin2 that are physically separated from each other. Accordingly, pull-down transistor PD1 is a double-fin transistor comprising two sub transistors PD-11 and PD-12, with sub transistor PD-11 being formed of fin Fin1 and gate strip (which may be a polysilicon strip or metal compound strip) G1, and sub transistor PD-12 being formed of fin Fin2 and gate strip G1.

Pass-gate transistor PG1 includes only one fin, which is Fin1. Accordingly, pass-gate transistor PG1 is a single-fin transistor formed of fin Fin1 and gate strip G2. It is observed that gate strip G2 also extends over fin Fin2. However, the source/drain region Dummy1-SD of the transistor (referred to as dummy transistor Dummy1 hereinafter) formed of fin Fin2 and gate strip G2 is electrically disconnected from the bit line contact BL-contact, and hence transistor Dummy1 is a dummy transistor that is not turned on and off simultaneously with pass-gate transistor PG1. Accordingly, in the embodiments wherein all fins have the same fin width, the beta ratio may be about 2. Similarly, the second port of the SRAM cell includes dummy transistors Dummy2.

In an embodiment, fin Fin1 is a straight fin, while fin Fin2 is a bended fin comprising three portions Fin2-1, Fin2-2, and Fin2-3. Portion Fin2-1 forms the source, the drain, and the channel region of sub transistor PD-12. Portion Fin2-3 forms the dummy transistor Dummy1 with gate strip G2. Portions Fin2-1 and Fin2-3 are parallel to fin Fin1, while portion Fin2-2 is not parallel to, and may be perpendicular to, straight fin Fin1.

Figure 3A:
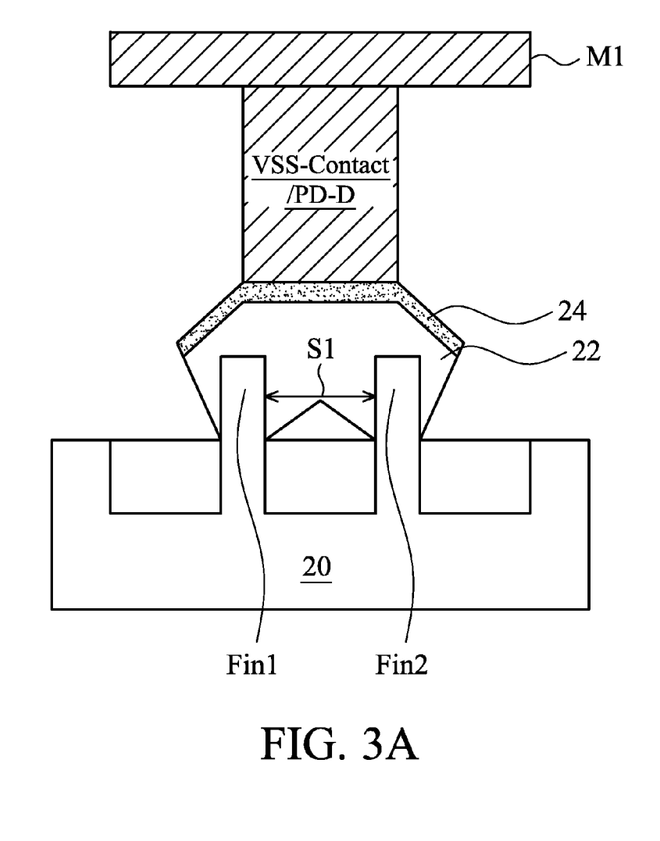
FIGS. 3A and 3B are cross-sectional views of the SRAM cell shown in FIG. 2.
Figure 3B:
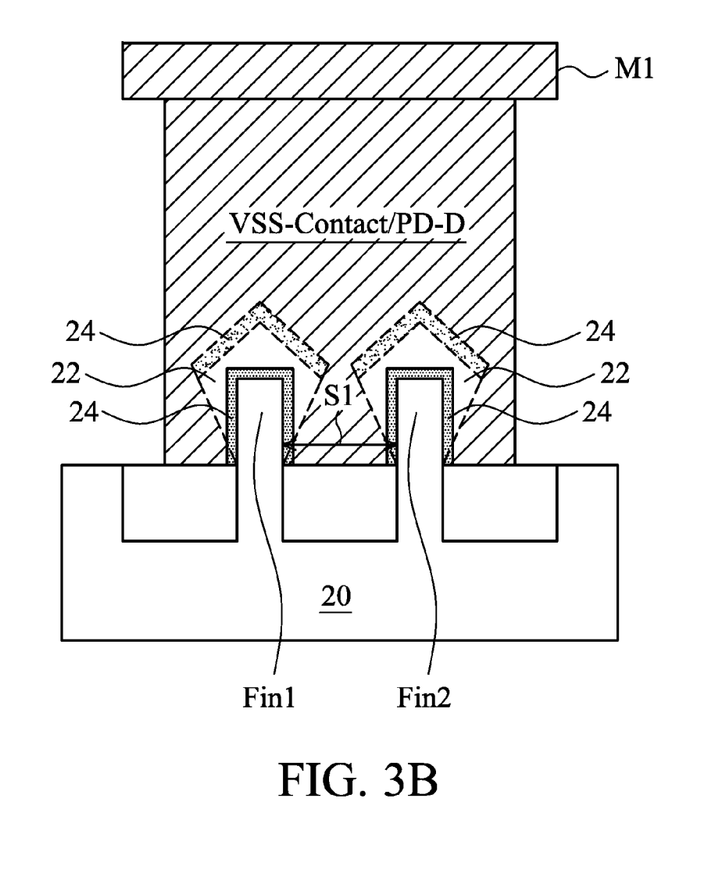

FIGS. 3A and 3B illustrate a cross-sectional view of the structure shown in FIG. 2, wherein the cross-sectional view is obtained from the planes crossing lines 3-3 in FIG. 2, which planes cross the source and drain regions of sub transistors PD-11 and PD-12. Referring to FIG. 3A, fins Fin1 and Fin2 are closely located. In an embodiment, the distance S1 between fins Fin1 and Fin2 is the minimum allowable spacing of the forming technology. For example, in 45 nm technology, distance S1 may be about 60 to about 90 nm. In alternative embodiment, S1 is less than about 60 nm. One skilled in the art will realize, however, that the dimensions recited throughout the description are merely examples, and will change if different formation technologies are used. Fins Fin1 and Fin2 may be formed of a same material as the underlying substrate 20, which may be formed of silicon, silicon germanium, silicon carbon, or the like. Epitaxial layer 22 is formed on fins Fin1 and Fin2 and electrically interconnects the physically separated fins Fin1 and Fin2. The portion of epitaxial layer 22 formed on fin Fin1 is merged with the portion of epitaxial layer 22 on fin Fin2 to form a continuous semiconductor layer 22. Epitaxial layer 22 may have a composition different from that of fins Fin1 and Fin2. Source/drain silicide region 24 may be formed on epitaxial layer 22. A contact, which may be contact VSS-contact or contact PD-D (refer to FIG. 2), is formed on source/drain silicide region 24, and hence is electrically connected to fins Fin1 and Fin2. In an embodiment, contacts VSS-contact and PD-D are horizontally between fins Fin1 and Fin2, although it may also be formed directly over either, or both, of fins Fin1 and Fin2. In this embodiment, contacts VSS-contact and PD-D may have square shapes (FIG. 2) if viewed in a top view.

FIG. 3B illustrates an alternative embodiment, in which either no epitaxial layer 22 (illustrated using dotted lines) is formed on fins Fin1 and Fin2, or epitaxial layer 22 is formed, but the portions of epitaxial layer 22 on fins Fin1 and Fin2 are not merged. Contact VSS-contact extends directly over and connects the sources of sub transistors PD-11 and PD-12. Contact PD-D extends directly over and connects the drains of sub transistors PD-11 and PD-12. In this embodiment, contacts VSS-contact and PD-D may have rectangular shapes (when viewed in top views) with different widths and lengths.

Referring back to FIG. 2, it is observed that the portions of fins Fin1 and Fin2 in the source and drain portions of sub pull-down transistors PD-11 and PD-12 are physically disconnected from each. This is process friendly since joining fins Fin1 and Fin2 will incur severe process difficulty, particularly when 45 nm or under technologies are used. The problem is even severe if distance S1 between the fins Fin1 and Fin2 is small. However, by using the schemes in FIG. 3A or FIG. 3B, fins Fin1 and Fin2 may be electrically interconnected without incurring process difficulty. Further, distance S1 between fins Fin1 and Fin2 may be reduced to the minimum distance allowed by the forming technology. Accordingly, the respective SRAM cell occupies a small chip area.

Fin portion Fin2-3 is spaced apart from fin Fin1 by distance S2, which is greater than distance S1. In an embodiment, distance S2 is greater than about 125 percent, greater than about 150 percent, or even greater than about 180 percent distance S1. Accordingly, contact BL-contact, which is connected to a source/drain region of pass-gate transistor PG1, will not undesirably electrically interconnect the respective source/drain regions of pass-gate transistor PG1 and dummy transistor Dummy1.

Figure 4:
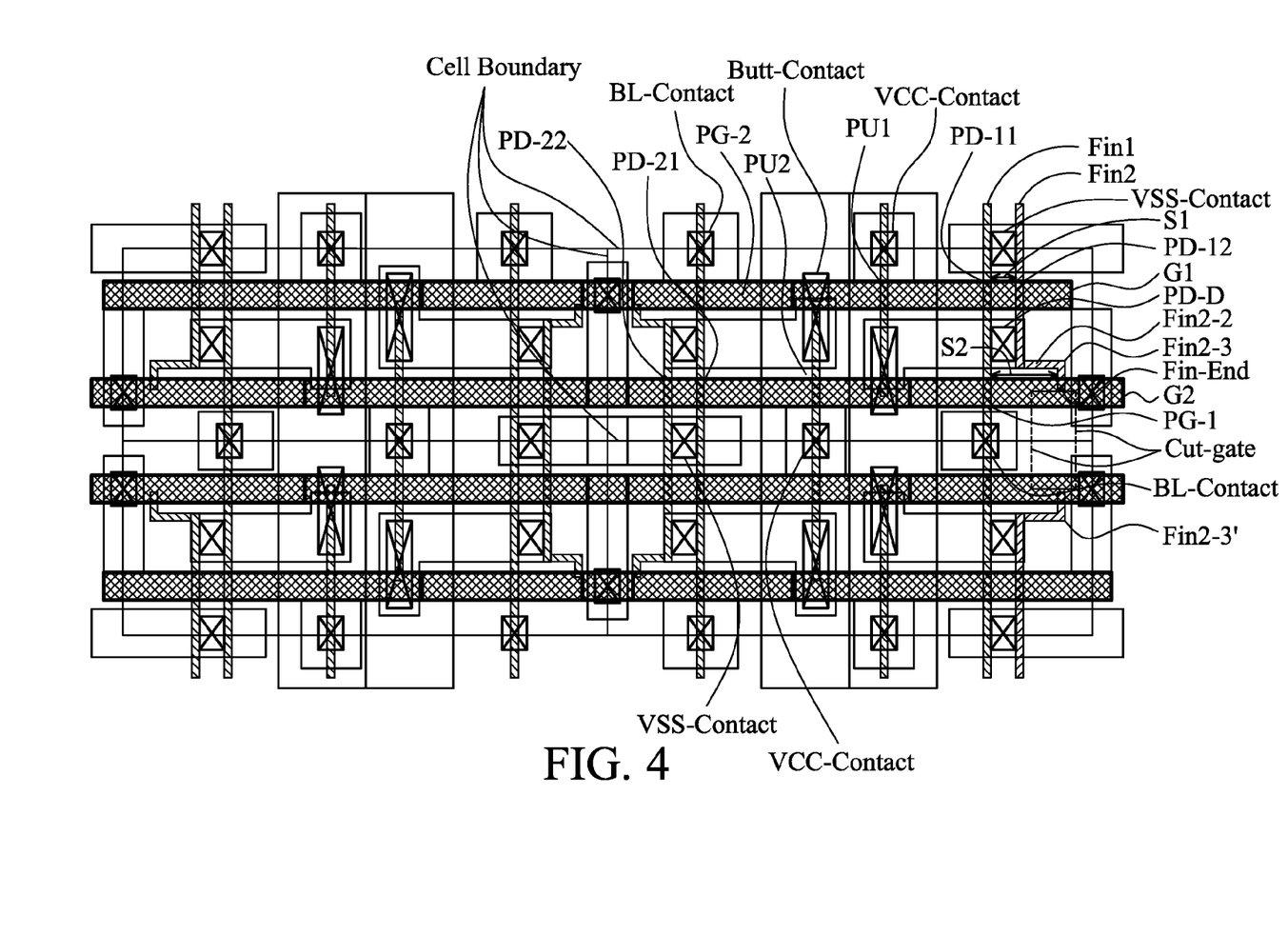
FIGS. 4 through 7 are layouts of the SRAM cell in accordance with alternative embodiments.

FIG. 4 illustrates an alternative layout of the SRAM as shown in FIG. 1. Unless specified otherwise, like reference numerals in FIGS. 4 through 7 represent like components in FIGS. 2 through 3B, and hence may not be repeated herein. The embodiment in FIG. 4 is essentially the same as the embodiment shown in FIG. 3, except fin portion Fin2-3 is disconnected from the fin portion Fin2-3 of the neighboring SRAM cell. As a comparison, in FIG. 2, fin portion Fin2-3 of an SRAM cell extends all the way to a boundary, and forms a single continuous fin with the fin portion Fin2-3 of a neighboring SRAM cell. FIG. 4 also illustrates the pattern of cut gate Cut-gate, which is the pattern in another lithograph mask. The formation of fins includes a step of forming fins and a step for removing an undesired portion, wherein the pattern Cut-gate is used to remove the undesirable portions of the fins. It is observed that with distance S2 being greater than distance S1, it is easy to cut fin Fin2 without causing fin Fin1 to be cut accidentally. As a result of cutting fin Fin2, the end cap Fin-End of fin portion Fin2-3 is spaced apart from all cell boundaries.

Figure 5:
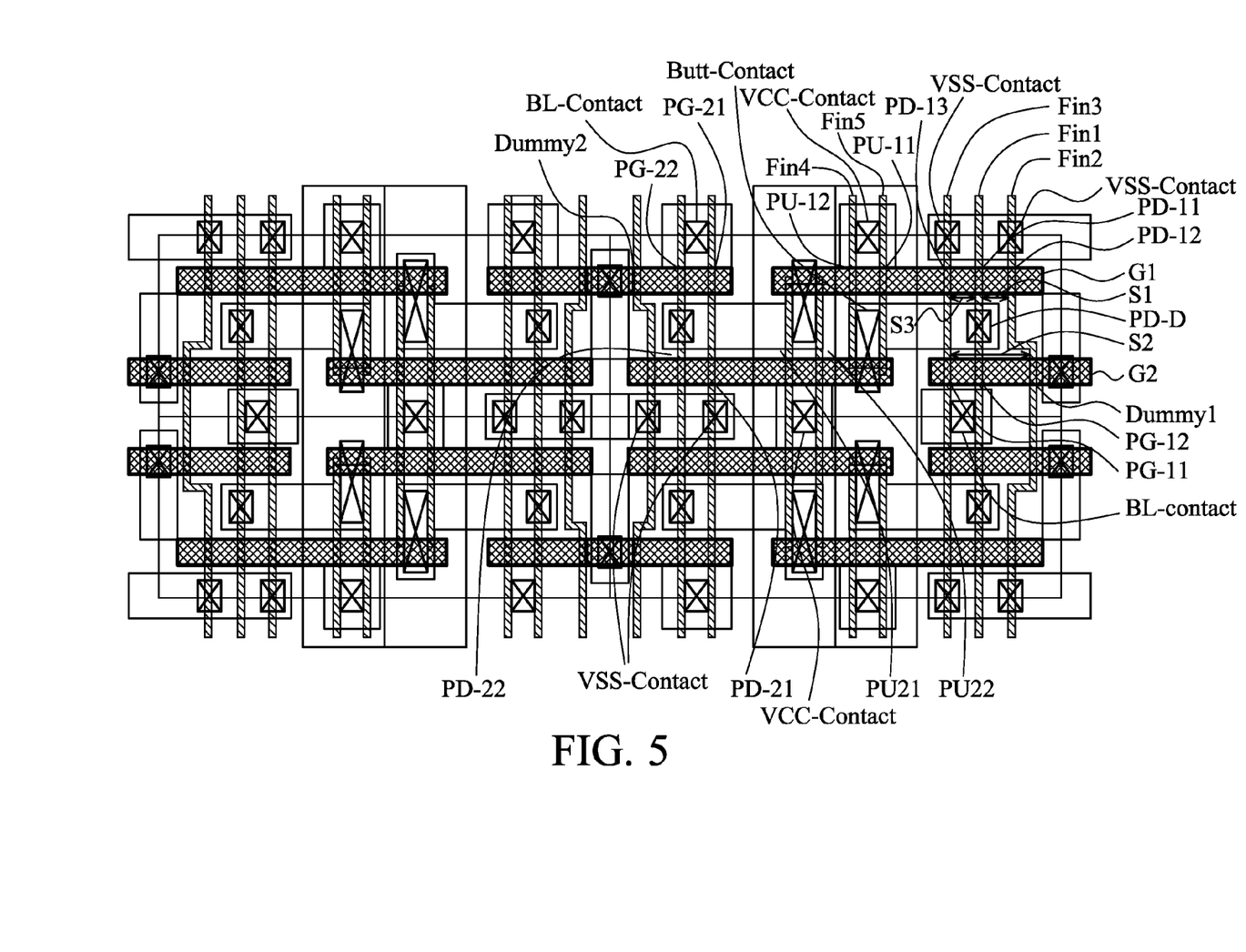

FIG. 5 illustrates an alternative layout of the SRAM cell shown in FIG. 1. In this embodiment, straight fin Fin3 is added, and is parallel to straight fin Fin1. The distance S3 between fins Fin1 and Fin3 may be equal to, or greater than, distance S1. Pull-down transistor PD thus may be a triple-fin transistor comprising sub transistors PD-11, PD-12, and PD-13. Contacts VSS-contact and PD-D may be connected to the source and drain regions of sub pull-down transistors PD-11, PD-12, and PD-13 using essentially the same schemes as in FIGS. 3A and 3B, which are through either the epitaxial layer or the large contacts that extend directly over and electrically connect all three fins Fin1, Fin2, and Fin3.

Pass-gate transistor PG1 (denoted as PG-11 and PG-12) is a double-fin transistor comprising sub transistors PG-11 and PG-12. Contacts VSS-contact and PD-D may be connected to the source and drain regions of sub pull-down transistors using PD-11, PD-12, and PD-13 using essentially the same schemes as in FIG. 3A or FIG. 3B. The SRAM cell has a beta ratio equal to about 1.5. Further, pull-up transistor PU1 is a double-fin transistor comprising sub transistors PU-11 and PU-12, which are formed of fins Fin4 and Fin5 and gate strip G1. Contact VCC-contact may be connected to the source regions of pull-up transistors using essentially the same scheme as in FIG. 3A or FIG. 3B. Accordingly, the SRAM cell has an alpha ratio equal to about 1.

Figure 6:
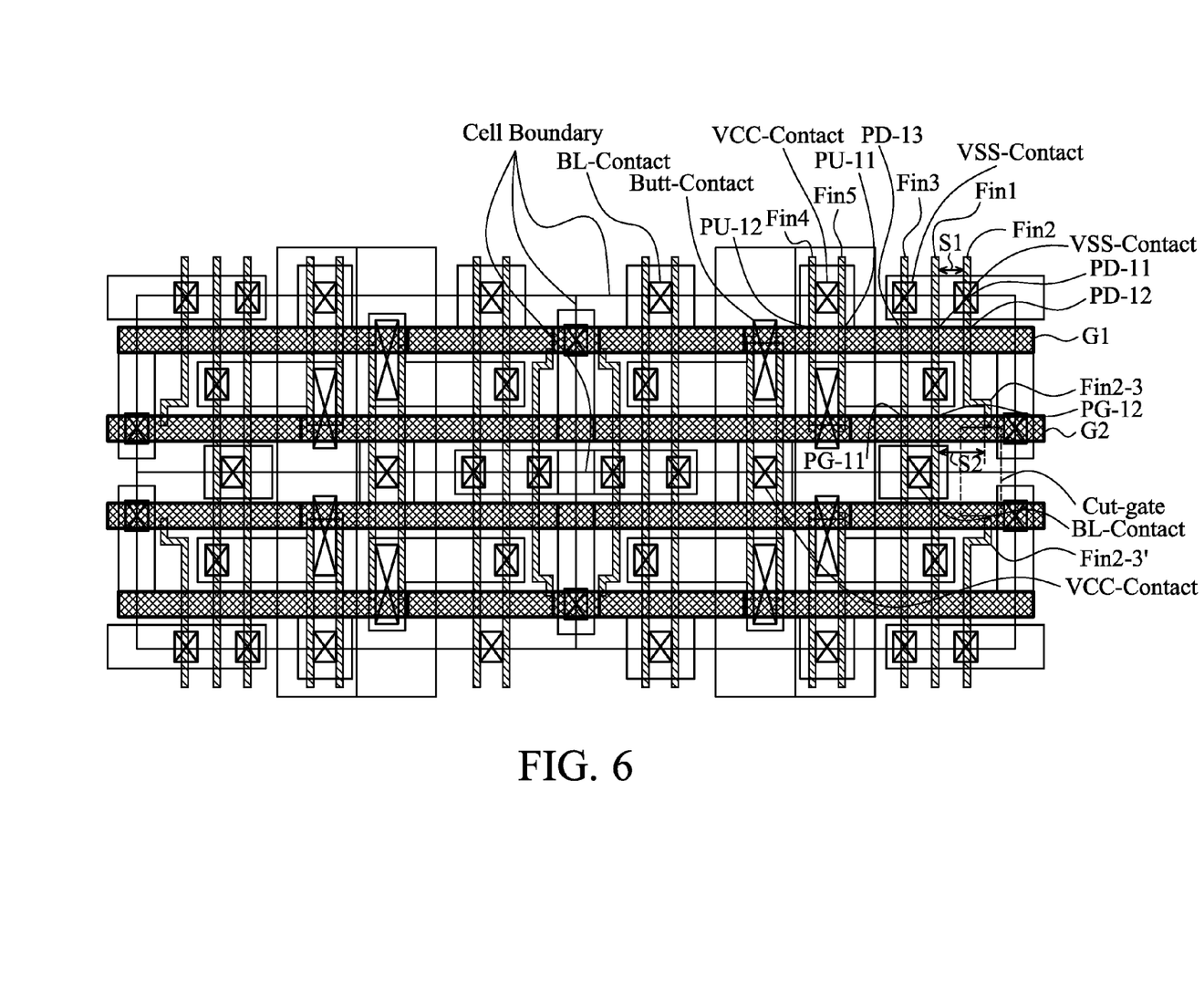

FIG. 6 illustrates an alternative layout of the SRAM as shown in FIG. 1. This embodiment is essentially the same as the embodiment shown in FIG. 5, except fin portion Fin2-3 is disconnected from the Fin portion Fin2-3' of a neighboring SRAM cell. Similarly, cut gate Cut-gate may be used to cut fin Fin2. As a result, the end cap of fin Fin2 is spaced apart from all cell boundaries. Similarly, with distance S2 being greater than distance S1, it is easy to cut fin Fin2 without causing fin Fin1 to be cut undesirably.

Figure 7:
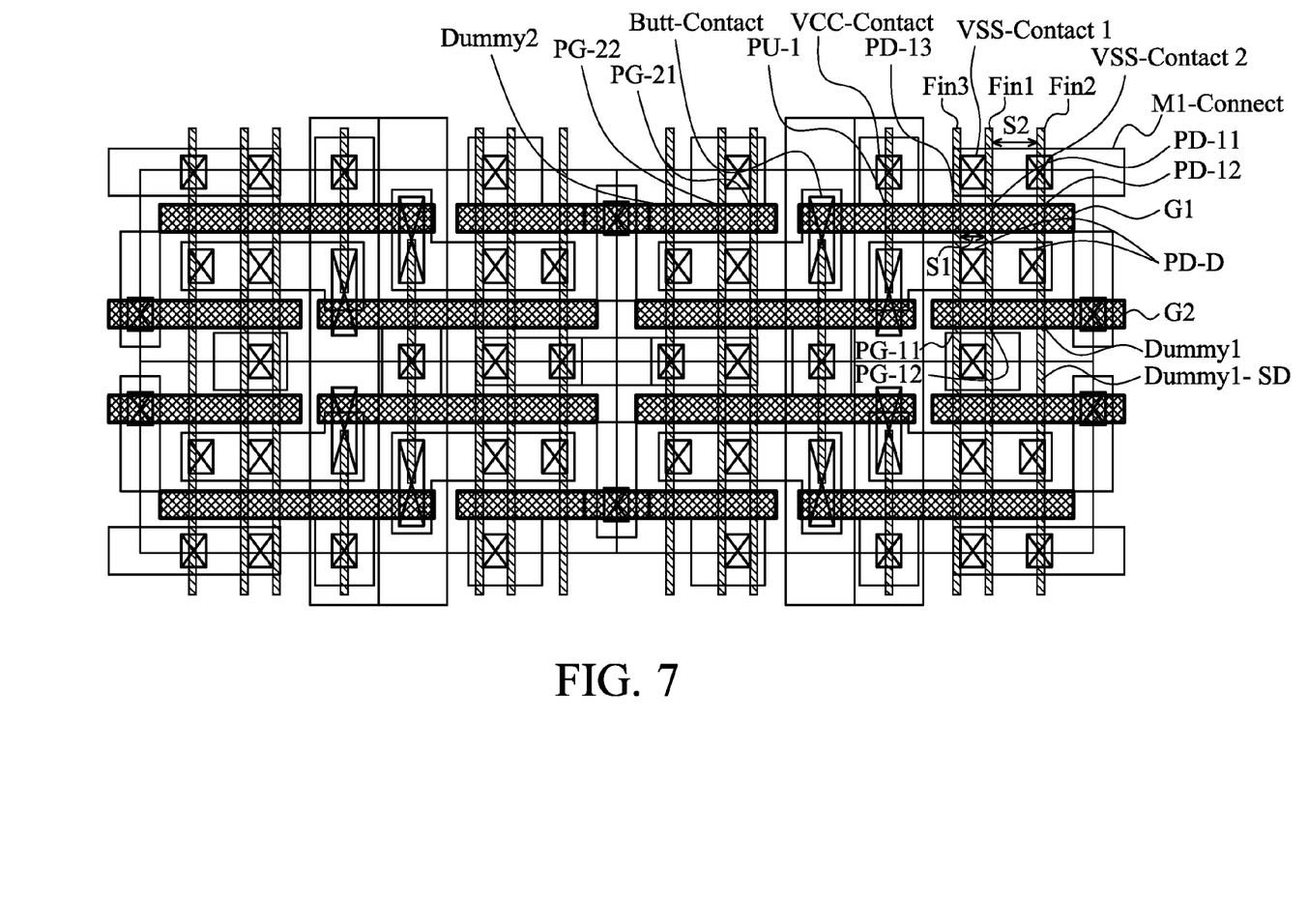

FIG. 7 illustrates yet another layout of the SRAM as shown in FIG. 1 in accordance with another embodiment. In this embodiment, fins Fin1, Fin2, and Fin3 are all parallel, and may all be straight. Fins Fin1 and Fin3 have distance S1, which may be the minimum distance allowed by the forming technology. Fins Fin1 and Fin 2 have distance S2 that is greater than distance S1. The exemplary values of distances S1 and S2 (refer to FIG. 3) are discussed in preceding paragraphs, and hence are not repeated herein.

In FIG. 7, with the small distance between fins Fin1 and Fin3, the source regions (and drain regions) of sub transistors PD-11 and PD-13 are interconnected using essentially the same scheme as shown in FIG. 3A or FIG. 3B (for example, through contact VSS-contact1). On the other hand, distance S2 is great enough, and hence the source regions (and drain regions) of sub transistors PD-11 and PD-12 are not connected using the scheme as shown in FIG. 3A or FIG. 3B. Instead, contact VSS-contact2 (which is connected to the source of sub transistor PD-12) is electrically connected to the sources of sub pull-down transistors PD-11 and PD-13 through metal line M1-connect. Metal line M1-connect may be in the bottom metallization layer (commonly known as M1, please refer to FIGS. 3A and 3B) immediately overlying contacts VSS-contact1 and VSS-contact2. The drain side connection of sub pull-down transistors PD-11, PD-12, and PD-13 may be essentially the same as on the source side.

Pass-gate transistor PG1 (including and denoted as PG-11 and PG-12) is a double-fin transistor comprising sub transistor PG-11, which is formed of fin3 and gate strip G2, and sub transistor PG-12, which is formed of fin Fin1 and gate strip G2. It is observed that gate strip G2 also extends over fin Fin2. The source/drain region Dummy1-SD of transistor Dummy1 is electrically disconnected from the bit line contact BL-contact, and hence transistor Dummy1 is also a dummy transistor that is not turned off and off simultaneously with sub pass-gate transistors PG-11 and PG-12. Accordingly, the beta ratio of the SRAM cell shown in FIG. 7 may be about 1.5. Similarly, the alpha ratio is about 1.

In the embodiments, the multiple fins of the pull-down transistors are electrically connected, and physically disconnected. This may be achieved by either bending the fins or forming dummy transistors. The respective layout is process friendly, especially for small-scale integrated circuits, for example, 45 nm or under. The beta ratios of the respective SRAM cells are increased to greater than 1, and hence the cell stability is improved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
   a matrix of memory cells, a first memory cell of the matrix of memory cells including
      a first pull-up transistor comprising a first source region and a first drain region within a first fin, and having a first gate electrode extending over the first fin;
      a first pull-down transistor comprising a second source region within both a second fin and a third fin and a second drain region within both the second fin and the third fin, and having the first gate electrode extending over the second fin and the third fin;
      a first pass gate transistor comprising a third source region and a third drain region within the second fin, and having a second gate electrode extending over the second fin and the third fin;
      a second pull-up transistor comprising a fourth source region and a fourth drain region within a fourth fin, and having a third gate electrode extending over the fourth fin;
      a second pull-down transistor comprising a fifth source region within both a fifth fin and a sixth fin and a fifth drain region within both the fifth fin and the sixth fin, and having the third gate electrode extending over the fifth fin and the sixth fin;
      a second pass gate transistor comprising a sixth source region and a sixth drain region within the fifth fin, and having fourth gate electrode extending over the fifth fin and the sixth fin;
      a seventh fin interjacent the second fin and the third fin;
      the second source region and the second drain region, respectively, extending within the seventh fin; and
      the third source region and the third drain region, respectively, extending within the seventh fin.

2. The integrated circuit of claim 1 wherein each of the first, second, third, fourth, fifth, and sixth fins are parallel to one another.

3. The integrated circuit of claim 1 wherein the first memory cell further comprises:
   an eighth fin interjacent the fifth fin and the sixth fin;
   the fifth source region and the fifth drain region, respectively, extending within the eighth fin; and
   the sixth source region and the sixth drain region, respectively, extending within the eighth fin.

4. The integrated circuit of claim 3 wherein the second, third, fourth, fifth, sixth, seventh, and eighth fins, respectively, extend beyond a cell boundary of the first memory cell and wherein the first fin terminates within the cell boundary of the first memory cell.

5. The integrated circuit of claim 1, wherein the matrix of memory cells includes a second memory cell including
   a third pull-up transistor comprising a seventh source region and a seventh drain region within the first fin, and having a fifth gate electrode extending over a ninth fin;

a third pull-down transistor comprising an eighth source region within both the second fin and the third fin and an eighth drain region within both the second fin and the third fin, and having the fifth gate electrode extending over the second fin and the third fin;

a third pass gate transistor comprising a ninth source region and a ninth drain region within the second fin, and having a sixth gate electrode extending over the second fin and the third fin;

a fourth pull-up transistor comprising a tenth source region and a tenth drain region within the fourth fin, and having a seventh gate electrode extending over the fourth fin;

a fourth pull-down transistor comprising an eleventh source region within both the fifth fin and the sixth fin and an eleventh drain region within both the fifth fin and the sixth fin, and having the seventh gate electrode extending over the fifth fin and the sixth fin; and a fourth pass gate transistor comprising a twelfth source region and a twelfth drain region within the fifth fin, and having an eighth gate electrode extending over the fifth fin and the sixth fin.

6. The integrated circuit of claim 1 wherein the second fin and the seventh fin are spaced apart from one another by a first spacing and the third fin and the seventh fin are spaced apart from one another by a second spacing, the second spacing being greater than the first spacing.

7. The integrated circuit of claim 6 wherein the first spacing is from about 60 nm to about 90 nm.

8. An integrated circuit comprising:
a first memory cell and a second memory cell, each memory cell including at least eight fins, wherein
a first fin contains a first source region and a first drain region for a first pull-up transistor;
a second fin and a third fin contain a second source region and a second drain region for a first pull-down transistor;
the second fin further contains a third source region and a third drain region for a first pass gate transistor;
a fourth fin contains a fourth source region and a fourth drain region for a second pull-up transistor;
a fifth fin and a sixth fin contain a fifth source region and a fifth drain region for a second pull-down transistor; and
the fifth fin further contains a sixth source region and a sixth drain region for a second pass gate transistor; wherein
the second fin and the third are common to the first memory cell and the second memory cell; and
the fifth fin and the sixth fin are common to the first memory cell and the second memory cell.

9. The integrated circuit of claim 8 further comprising:
a seventh fin interjacent the second and the third fins and being spaced closer to the second fin than to the third fin; and an eighth fin interjacent the fifth and sixth fins and being spaced closer to the fifth fin than the sixth fin.

10. The integrated circuit of claim 9 further including a first epitaxial layer connecting the third fin and the seventh fin and a second epitaxial layer connecting the fifth fin and the eight fin.

11. The integrated circuit of claim 8 wherein each of the first through sixth fins are in parallel.

12. The integrated circuit of claim 8 wherein the memory cells are static random access memory cells (SRAMs).

13. An integrated circuit comprising:
a matrix of memory cells, a first memory cell of the matrix of memory cells including
a first pull-up transistor comprising a first source region and a first drain region within a first fin, and having a first gate electrode extending over the first fin;
a first pull-down transistor comprising a second source region within both a second fin and a third fin and a second drain region within both the second fin and the third fin, and having the first gate electrode extending over the second fin and the third fin;
a first pass gate transistor comprising a third source region and a third drain region within the second fin, and having a second gate electrode extending over the second fin and the third fin, wherein the second fin extends to a boundary of the memory cell and forms a continuous semiconductor fin with an additional fin of an additional memory cell.

14. The integrated circuit of claim 13, wherein each of the first, second, and third fin is a straight fin.

15. The integrated circuit of claim 14, further comprising:
a second pull-up transistor comprising a fourth source region and a fourth drain region within a fourth straight fin, and having a third gate electrode extending over the fourth straight fin;
a second pull-down transistor comprising a fifth source region within both a fifth straight fin and a sixth straight fin and a fifth drain region within both the fifth straight fin and the sixth straight fin, and having the third gate electrode extending over the fifth straight fin and the sixth straight fin; and
a second pass gate transistor comprising a sixth source region and a sixth drain region within the fifth straight fin, and having fourth gate electrode extending over the fifth straight fin and the sixth straight fin.

16. The integrated circuit of claim 13, wherein the memory cell is an SRAM cell.

17. The integrated circuit of claim 13, wherein the first gate electrode and the second gate electrode are parallel to one another.

18. The integrated circuit of claim 13, wherein the first fin and third fin are separated by a first distance, and the first fin and second fin are separated by a second distance, the second distance being greater than the first distance.

* * * * *